United States Patent
Sandhu et al.

[19]

[11] Patent Number: 6,103,570
[45] Date of Patent: *Aug. 15, 2000

[54] METHOD OF FORMING CAPACITORS HAVING AN AMORPHOUS ELECTRICALLY CONDUCTIVE LAYER

[75] Inventors: Gurtej S. Sandhu, Boise; Kris K. Brown, Garden City, both of Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/869,731

[22] Filed: Jun. 5, 1997

Related U.S. Application Data

[63] Continuation of application No. 08/444,852, May 19, 1995, Pat. No. 5,665,625.

[51] Int. Cl.[7] .................................. H01L 21/8242
[52] U.S. Cl. ............................. 438/255; 438/398
[58] Field of Search ................... 438/3, 238–240, 438/250–256, 381, 393–399

[56] References Cited

U.S. PATENT DOCUMENTS

| | | | |
|---|---|---|---|
| 5,057,447 | 10/1991 | Paterson | 437/52 |
| 5,082,797 | 1/1992 | Chan et al. | 437/52 |
| 5,142,438 | 8/1992 | Reinberg et al. | 437/52 |
| 5,162,248 | 11/1992 | Dennison et al. | 437/52 |

(List continued on next page.)

FOREIGN PATENT DOCUMENTS

| | | |
|---|---|---|
| 1-222469 | 6/1989 | Japan . |
| WO 87/05152 | 8/1987 | WIPO . |

OTHER PUBLICATIONS

H. Watanabe, et al. "A New Cylindrical Capacitor Using Hemispherical Crained Si (HSG–Si) for 256Mb DRAMs", 1992 IEEE pp. 259–262.

Aoki, T. Hashimoto, et al., Jpn. J. Appl. Phys. 32, 376 (1993).

T. Kamiyana, et al., IEDM Tech. Dig., 1991, 827.

P.C. Fazan, et al., IEDM Tech. Dig., 1992, 263.

L.R. Doolittle, et al., Nucl. Instrum. Methods, B 15, 227 (1986).

G.S. Sandhu, et al., Appl. Phys. Lett., 62, 240 (1993).

(List continued on next page.)

*Primary Examiner*—Jey Tsai
*Attorney, Agent, or Firm*—Wells, St. John, Roberts, Gregory & Matkin P.S.

[57] ABSTRACT

A method of forming a capacitor includes, a) providing a node to which electrical connection to a capacitor is to be made; b) providing a first electrically conductive capacitor plate over the node, the capacitor plate comprising conductively doped polysilicon; c) providing a predominately amorphous electrically conductive layer over the first capacitor plate; d) providing a capacitor dielectric layer over the amorphous electrically conductive layer; and e) providing a second electrically conductive capacitor plate over the capacitor dielectric layer. A capacitor construction is also disclosed. The invention has greatest utility where the polysilicon layer covered with the amorphous conductive layer is a roughened outer layer, such as provided with hemispherical grain polysilicon. The preferred amorphous electrically conductive layer is metal organic chemical vapor deposited $TiC_xN_yO_z$, where "x" is in the range of from 0.01 to 0.5, and "y" is in the range of from 0.99 to 0.5, and "z" is in the range of from 0 to 0.3, with the sum of "x", "y" and "z" equalling about 1.0; and the step of metal organic chemical vapor depositing $TiC_xN_yO_z$ comprises utilizing a gaseous titanium organometallic precursor of the formula $Ti(NR_2)_4$, where R is selected from the group consisting of H and a carbon containing radical, and utilizing deposition conditions of from 200° C. to 600° C. and from 0.1 to 100 Torr.

9 Claims, 1 Drawing Sheet

U.S. PATENT DOCUMENTS

| | | | |
|---|---|---|---|
| 5,168,073 | 12/1992 | Gonzalez et al. | 437/47 |
| 5,192,589 | 3/1993 | Sandhu | 427/255.1 |
| 5,234,857 | 8/1993 | Kim et al. | 437/47 |
| 5,246,881 | 9/1993 | Sandhu et al. | 437/192 |
| 5,278,091 | 1/1994 | Fazan et al. | 437/52 |
| 5,279,985 | 1/1994 | Kamiyama | 437/60 |
| 5,302,540 | 4/1994 | Ko et al. | 437/47 |
| 5,314,656 | 5/1994 | Munir et al. | 419/13 |
| 5,324,679 | 6/1994 | Kim et al. | 437/47 |
| 5,335,138 | 8/1994 | Sandhu et al. | 361/303 |
| 5,338,700 | 8/1994 | Dennison et al. | 437/60 |
| 5,340,763 | 8/1994 | Dennison et al. | 437/52 |
| 5,340,765 | 8/1994 | Dennison et al. | 437/52 |
| 5,418,180 | 5/1995 | Brown | 437/60 |
| 5,442,213 | 8/1995 | Okudaira et al. | 257/310 |
| 5,466,629 | 11/1995 | Mihara et al. | 437/60 |
| 5,489,548 | 2/1996 | Nishioka et al. | 437/60 |
| 5,504,041 | 4/1996 | Summerfelt et al. | 437/225 |
| 5,608,247 | 3/1997 | Brown | 257/306 |
| 5,663,088 | 9/1997 | Sandhu et al. | 438/396 |
| 5,665,431 | 9/1997 | Narasimhan | 427/255 |
| 5,665,625 | 9/1997 | Sandhu et al. | 438/396 |
| 5,717,250 | 2/1998 | Schuele et al. | 257/754 |

OTHER PUBLICATIONS

Ishihara, K. et al., Characterization of CVD–TiN Films Prepared with Metalorganic Source, vol. 29, No. 10, Oct. 1990, pp. 2103–2105.

Katz, A. et al., The Immunence of Ammonia on rapid–thermal low–pressure metalorganic chemical vapor deposited $TiN_x$ films from tetrakis (dimethylamido) titanium precursor onto InP, J. Appl. Phys. 71(2), Jan. 15, 1992, pp. 993–1000.

Zaima, S. et al., J. Electrochem. Soc., vol. 137, No. 9, Sep. 1990, The Electrochemical Society.

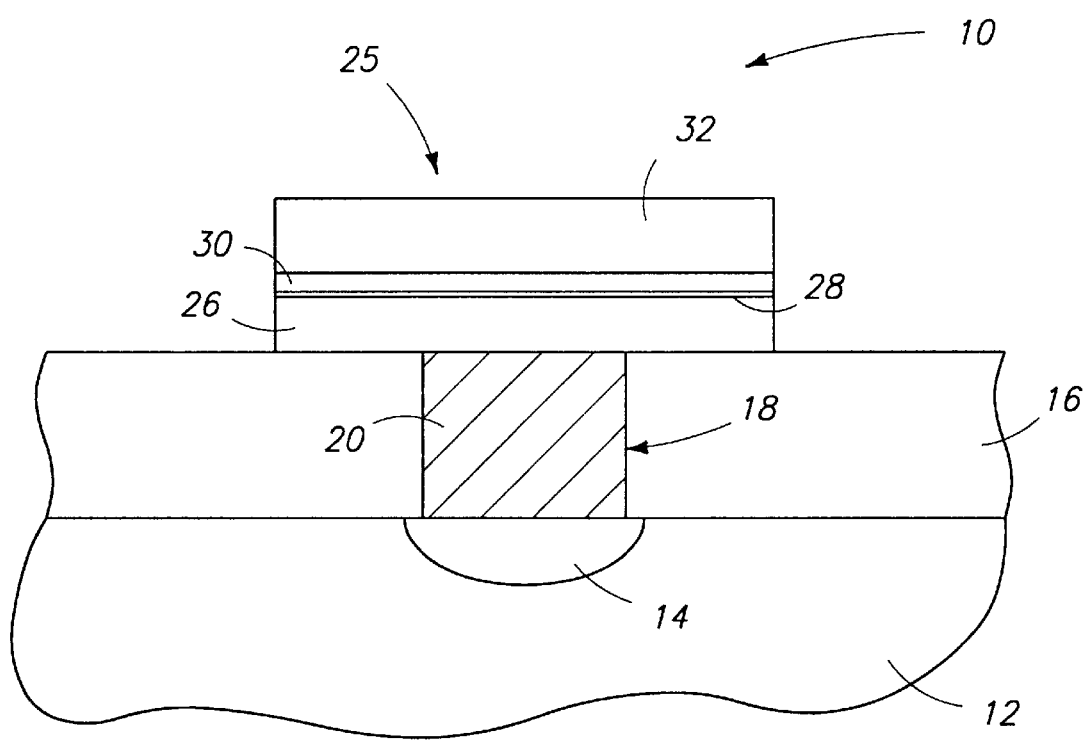
_Fig. 2_

METHOD OF FORMING CAPACITORS HAVING AN AMORPHOUS ELECTRICALLY CONDUCTIVE LAYER

RELATED PATENT DATA

The present application is a continuation application of application Ser. No. 08/444,852, U.S. Pat. No. 5,665,625 and which was filed on May 19, 1995.

TECHNICAL FIELD

This invention relates generally to semiconductor processing methods of forming capacitors and to capacitor constructions.

BACKGROUND OF THE INVENTION

The reduction in memory cell size required for high density dynamic random access memories (DRAMs) results in a corresponding decrease in the area available for the storage node of the memory cell capacitor. Yet, design and operational parameters determine the minimum charge required for reliable operation of the memory cell despite decreasing cell area. Several techniques have been developed to increase the total charge capacity of the cell capacitor without significantly affecting the cell area. These include structures utilizing trench and stacked capacitors, as well as the utilization of new capacitor dielectric materials having higher dielectric constants.

One common material utilized for capacitor plates is conductively doped polysilicon. Such is utilized because of its compatibility with subsequent high temperature processing, good thermal expansion properties with $SiO_2$, and its ability to be conformally deposited over widely varying typography.

As background, silicon occurs in crystalline and amorphous forms. Further, there are two basic types of crystalline silicon known as monocrystalline silicon and polycrystalline silicon. Polycrystalline silicon, polysilicon for short, is typically in situ or subsequently conductively doped to render the material conductive. Monocrystalline silicon is typically epitaxially grown from a silicon substrate. Silicon films deposited on dielectrics (such as $SiO_2$ and $Si_3N_4$) result in either an amorphous or polycrystalline phase. Specifically, it is generally known within the prior art that silicon deposited at wafer temperatures of less than approximately 580° C. will result in an amorphous silicon layer, whereas silicon deposited at temperatures higher than about 580° C. will result in a polycrystalline layer. The specific transition temperature depends on the source chemicals/precursors used for the deposition.

The prior art has recognized that capacitance of a polysilicon layer can be increased merely by increasing the surface roughness of the polysilicon film that is used as a capacitor storage node. Such roughness is typically transferred to the cell dielectric and overlying polysilicon layer interfaces, resulting in a larger surface area for the same planar area which is available for the capacitor. One procedure utilized to achieve surface roughening involves deposition under conditions which are intended to inherently induce a rough or rugged upper polysilicon surface. Such include low pressure chemical vapor deposition (LPCVD) techniques. Yet, such techniques are inherently unpredictable or inconsistent in the production of a rugged polysilicon film.

One type of polysilicon film which maximizes a roughened outer surface area is hemispherical grain polysilicon. Such can be deposited or grown by a number of techniques. One technique includes direct LPCVD formation at 590° C. Another includes formation by first depositing an amorphous silicon film at 550° C. using He diluted $SiH_4$ (20%) gas at 1.0 Torr, followed by a subsequent high temperature transformation anneal. Hemispherical grain polysilicon is not, however, in situ doped during its deposition due to undesired reduction in grain size in the resultant film. Accordingly, doping after deposition is typically conducted with hemispherical grain polysilicon films.

Unfortunately, roughened polysilicon films suffer from dopant depletion whereby the conductivity dopant moves outwardly into the adjacent capacitor dielectric layer. Further, roughened polysilicon films have a considerable number of exposed crystalline triple points, which constitute locations where three individual crystals join. These triple points result in formation or propagation of cracks throughout the overlying $Si_3N_4$ layer when it is deposited. These cracks and the dopant depletion result in undesired current leakage paths in the dielectric layer, which effectively increases the minimum cell nitride thickness which can be used, and thus lowers the capacitance of the deposited film. This counters the goal of maximized capacitance in minimum space. Alternate materials to $Si_3N_4$ have been proposed, but are difficult to integrate into existing process flows.

Accordingly, it would be desirable to develop processes and capacitor constructions which enable continued use of rough polysilicon for capacitor plates and continued use of $Si_3N_4$ for the capacitor dielectric.

BRIEF DESCRIPTION OF THE DRAWINGS

Preferred embodiments of the invention are described below with reference to the following accompanying drawings.

FIG. 1 is a diagrammatic cross sectional view of a semiconductor wafer fragment in accordance with the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming a capacitor comprises the following steps:

providing a node to which electrical connection to a capacitor is to be made;

providing a first electrically conductive capacitor plate over the node;

providing a predominately amorphous electrically conductive layer over the first capacitor plate;

providing a capacitor dielectric layer over the amorphous electrically conductive layer; and providing a second electrically conductive capacitor plate over the capacitor dielectric layer.

In accordance with another aspect of the invention, a capacitor comprises:

a first electrically conductive capacitor plate;

a predominately amorphous electrically conductive layer over the first capacitor plate;

a capacitor dielectric layer over the amorphous electrically conductive layer; and a second electrically conductive capacitor plate over the capacitor dielectric layer.

In accordance with still a further aspect of the invention, a capacitor comprises:

a first electrically conductive capacitor plate, the capacitor plate comprising an outer layer of rough hemispherical grain polysilicon;

a predominately amorphous electrically conductive layer over the hemispherical grain polysilicon;

a capacitor dielectric layer over the amorphous electrically conductive layer; and a second electrically conductive capacitor plate over the capacitor dielectric layer.

Referring to FIG. 1, a semiconductor wafer fragment in process is indicated generally with reference numeral 10. Such comprises a bulk substrate region 12 and an active area diffusion region 14. An insulating dielectric layer 16, typically borophosphosilicate (BPSG), is provided atop substrate 12. A contact opening 18 is provided therein, and is filled with a conductive plugging material 20. Example preferred materials would include tungsten or conductively doped polysilicon. Plug 20 and layer 16 have been planarized, with plug 20 constituting a node to which electrical connection to a capacitor is to be made.

Numeral 25 designates such a capacitor construction. Such comprises a first electrically conductive capacitor plate 26 comprising conductively doped polysilicon. Typically and most preferably in accordance with the invention, layer 26 comprises one or more layers of polysilicon, with the ouser layer being hemispherical grain polysilicon having a very roughened outer surface for maximizing capacitance. As described above, such roughened polysilicon outer surface exposes a considerable amount of polycrystalline grain triple points. An example and preferred thickness for composite layer 26 is from 400 Angstroms to 1000 Angstroms.

A predominately amorphous electrically conductive layer 28 is provided over first capacitor plate 26. An example and preferred material is metal organic chemical vapor deposited $TiC_xN_yO_z$, where "x" is in the range of from 0.01 to 0.5, and "y" is in the range of from 0.99 to 0.5, and "z" is in the range of from 0 to 0.3, with the sum of "x", "y" and "z" equalling about 1.0. Most preferably, the deposition utilizes a gaseous titanium organometallic precursor of the formula $Ti(NR_2)_4$, where R is selected from the group consisting of H and a carbon containing radical. Example and preferred deposition conditions are from 200° C. to 600° C., and from 0.1 to 100 Torr to produce the desired predominately amorphous layer. An example and preferred thickness for layer 28 is from 50 to 100 Angstroms. A specific example is to use tetrakisdimethylamido titanium (TDMAT) at 450° C., and 93.3 Torr in a cold wall chemical vapor deposition reactor.

Also most preferably, "z" will be equal to zero. Unfortunately however, oxygen can undesirably become incorporated in the deposited film when it is exposed to oxygen, even ambient air. This incorporated oxygen undesirably affects conductivity. Accordingly, exposure to oxygen is preferably minimized until the subject film is covered by subsequent layers which can effectively act as a barrier to oxygen incorporation.

The conductively deposited amorphous layer provides a desired function of covering exposed crystalline triple points such that their presence does not propagate within and through a subsequently deposited dielectric layer. Such will facilitate continued use of $Si_3N_4$ in higher level integration density capacitors.

A capacitor dielectric layer 30, preferably $Si_3N_4$, is provided over amorphous electrically conductive layer 28. An example and preferred thickness is from 30 Angstroms to 80 Angstroms. Subsequently, a second electrically conductive capacitor plate 32 is provided over capacitor dielectric layer 30. Example materials for layer 32 include conductively doped polysilicon, or the above described $TiC_xN_yO_z$. An example and preferred thickness for plate 32 is 1000 Angstroms.

The invention arose out of concerns and problems associated with cracks in capacitor dielectric layers resulting from triple points in underlying polysilicon films, and to dopant depletion effects in polysilicon films in capacitors. However, the artisan will appreciate applicability of the invention to capacitor constructions and capacitor fabrication methods using conductive plates constituting materials other than polysilicon. For example, other conductive plate materials might generate a sufficiently roughened surface at the dielectric layer interface to result in crack propagation in the dielectric layer. Application of an amorphous conductive layer over such conductive plates prior to provision of the dielectric layer can preclude crack propagation in the such dielectric layer.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a capacitor comprising:

forming a first electrically conductive capacitor plate over a substrate, the first electrically conductive capacitor plate having an outer layer comprising hemispherical grain polysilicon;

forming a predominately amorphous electrically conductive layer over the first capacitor plate;

forming a capacitor dielectric layer over the predominately amorphous electrically conductive layer; and forming a second electrically conductive capacitor plate over the capacitor dielectric layer.

2. The method of forming a capacitor of claim 1 wherein the first capacitor plate is provided to comprise conductively doped polysilicon.

3. The method of forming a capacitor of claim 1 wherein the step of forming the amorphous electrically conductive layer comprises metal organic chemical vapor depositing $TiC_xN_yO_z$, where "x" is in the range of from 0.01 to 0.5, and "y" is in the range of from 0.99 to 0.5, and "z" is in the range of from 0 to 0.3, with the sum of "x", "y" and "z" equalling about 1.0.

4. The method of forming a capacitor of claim 1 wherein the step of forming the amorphous electrically conductive layer comprises metal organic chemical vapor depositing a $TiC_xN_yO_z$ layer over the polysilicon first capacitor plate, where "x" is in the range of from 0.01 to 0.5, and "y" is in the range of from 0.99 to 0.5, and "z" is in the range of from 0 to 0.3, with the sum of "x", "y" and "z" equalling about 1.0; and the step of metal organic chemical vapor depositing $TiC_xN_yO_z$ comprises utilizing a gaseous titanium organometallic precursor of the formula $Ti(NR_2)_4$, where R is selected from the group consisting of H and a carbon containing radical, and utilizing deposition conditions of from 200° C. to 600° C. and from 0.1 to 100 Torr.

5. The method of forming a capacitor of claim 1 wherein the capacitor dielectric layer comprises $Si_3N_4$.

6. The method of forming a capacitor of claim 1 wherein the first capacitor plate is provided to comprise conductively doped polysilicon, and the capacitor dielectric layer comprises $Si_3N_4$.

7. The method of forming a capacitor of claim 1 wherein the capacitor dielectric layer comprises $Si_3N_4$; and the step of forming the amorphous electrically conductive layer comprises metal organic chemical vapor depositing a $TiC_xN_yO_z$ layer over the polysilicon first capacitor plate, where "x" is in the range of from 0.01 to 0.5, and "y" is in the range of from 0.99 to 0.5, and "z" is in the range of from 0 to 0.3, with the sum of "x", "y" and "z" equalling about 1.0.

8. The method of forming a capacitor of claim 1 wherein the capacitor dielectric layer comprises $Si_3N_4$; and the step of forming the amorphous electrically conductive layer comprises metal organic chemical vapor depositing a $TiC_xN_yO_z$ layer over the polysilicon first capacitor plate, where "x" is in the range of from 0.01 to 0.5, and "y" is in the range of from 0.99 to 0.5, and "z" is in the range of from 0 to 0.3, with the sum of "x", "y" and "z" equalling about 1.0; and the step of metal organic chemical vapor depositing $TiC_xN_yO_z$ comprises utilizing a gaseous titanium organometallic precursor of the formula $Ti(NR_2)_4$, where R is selected from the group consisting of H and a carbon containing radical, and utilizing deposition conditions of from 200° C. to 600° C. and from 0.1 to 100 Torr.

9. A method of forming a capacitor comprising:

forming a first electrically conductive capacitor plate having an outer layer comprising hemispherical grain polysilicon over a substrate;

forming an electrically conductive layer over the first capacitor plate, the electrically conductive layer comprising titanium and carbon;

forming a capacitor dielectric layer over the electrically conductive layer; and forming a second electrically conductive capacitor plate over the capacitor dielectric layer.

\* \* \* \* \*

UNITED STATES PATENT AND TRADEMARK OFFICE
CERTIFICATE OF CORRECTION

PATENT NO : 6,103,570
DATED : August 15, 2000
INVENTOR(S) : Gurtej S. Sandhu and Kris K. Brown It is certified that error appears in the above-identified patent and that said Letters Patent are hereby corrected as shown below:

Col. 2, line 37
 replace "FIG. 1"
 with --The figure--.

Col. 3, line 14
 replace "FIG. 1"
 with --the figure--.

Col. 3, line 30
 replace "ouser"
 with --outer--.

Signed and Sealed this

Twenty-fourth Day of April, 2001

Attest:

NICHOLAS P. GODICI

*Attesting Officer*     *Acting Director of the United States Patent and Trademark Office*